United States Patent
Karri et al.

(10) Patent No.: US 11,875,564 B2
(45) Date of Patent: Jan. 16, 2024

(54) AUGMENTED REALITY BASED PART IDENTIFICATION

(71) Applicant: INTERNATIONAL BUSINESS MACHINES CORPORATION, Armonk, NY (US)

(72) Inventors: Venkata Vara Prasad Karri, Visakhapatnam (IN); Sarbajit K. Rakshit, Kolkata (IN); Girish Padmanabhan, Pune (IN); Abhijeet Sange, Pune (IN)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 17/446,470

(22) Filed: Aug. 31, 2021

(65) Prior Publication Data

US 2023/0063339 A1 Mar. 2, 2023

(51) Int. Cl.
*G06V 20/20* (2022.01)
*G06F 30/10* (2020.01)
(Continued)

(52) U.S. Cl.
CPC .............. *G06V 20/20* (2022.01); *G06F 1/163* (2013.01); *G06F 30/10* (2020.01); *G16Y 40/10* (2020.01);
(Continued)

(58) Field of Classification Search
CPC ........ G06V 20/20; G16Y 40/10; G16Y 40/35; G06F 30/10; G06F 1/163; H04L 67/12; G06T 19/006
(Continued)

(56) References Cited

U.S. PATENT DOCUMENTS 10,091,554 B1 * 10/2018 Newell .................. A61B 5/378
2017/0132841 A1 5/2017 Morrison
(Continued)

FOREIGN PATENT DOCUMENTS

KR 102033399 B1 11/2019

OTHER PUBLICATIONS

Griffiths, "New 3D Printing Material and AR App to Enable Automotive Collision Repairs," TCTmagazine.com, Jul. 31, 2019 [accessed on Jun. 6, 2021], 4 pages, Retrieved from the Internet: <URL: https://www.tctmagazine.com/additive-manufacturing-3d-printing-news/material-augmented-reality-automotive-collision-repairs/>.

(Continued)

*Primary Examiner* — Jin Ge
(74) *Attorney, Agent, or Firm* — Elliot J. Shine

(57) ABSTRACT

A method, computer system, and a computer program product for part identification is provided. The present invention may include observing a user interaction with a physical object using an IoT device. The present invention may include identifying the physical object within a knowledge corpus using one or more image analysis tools. The present invention may include leveraging an identity of the physical object to identify one or more similar interactions with the physical object stored in the knowledge corpus. The present invention may include generating one or more recommendations based on the one or more similar interactions with the physical object. The present invention may include transmitting a user selected recommendation.

19 Claims, 5 Drawing Sheets

(51) Int. Cl.
    *H04L 67/12*     (2022.01)
    *G16Y 40/10*     (2020.01)
    *G16Y 40/35*     (2020.01)
    *G06F 1/16*     (2006.01)
    *G06T 19/00*     (2011.01)

(52) U.S. Cl.
    CPC .............. *G16Y 40/35* (2020.01); *H04L 67/12* (2013.01); *G06T 19/006* (2013.01)

(58) Field of Classification Search
    USPC ........................................................ 345/633
    See application file for complete search history.

(56) References Cited

U.S. PATENT DOCUMENTS

| | | | |
|---|---|---|---|
| 2017/0190104 A1* | 7/2017 | Bostick | B33Y 10/00 |
| 2018/0081334 A1 | 3/2018 | Bostick | |
| 2018/0284955 A1* | 10/2018 | Canavor | G06F 16/29 |
| 2019/0325498 A1* | 10/2019 | Clark | G06Q 30/0625 |
| 2020/0043355 A1* | 2/2020 | Kwatra | G06Q 10/0633 |
| 2020/0051338 A1* | 2/2020 | Zia | G06F 9/451 |
| 2020/0166907 A1 | 5/2020 | Frederick | |
| 2020/0184217 A1* | 6/2020 | Faulkner | G06T 19/20 |
| 2020/0326683 A1* | 10/2020 | Oligschlaeger | H04L 9/0819 |
| 2021/0158422 A1* | 5/2021 | D'Souza | G06Q 30/0631 |
| 2021/0201378 A1* | 7/2021 | Piramuthu | G06F 16/9535 |

OTHER PUBLICATIONS

Lhachemi, et al., "Augmented Reality, Cyber-Physical Systems, and Feedback Control for Additive Manufacturing: A Review," IEEE Access, Mar. 5, 2019, 16 pages, vol. 7, arXiv: 1903.01808v1, Retrieved from the Internet: <URL: https://arxiv.org/pdf/1903.01808.pdf>.

Mell, et al., "The NIST Definition of Cloud Computing", National Institute of Standards and Technology, Special Publication 800-145, Sep. 2011, 7 pages.

Morris, "Augmented Reality Takes 3-D Printing to Next Level," Phys.org, Feb. 20, 2018 [accessed on Jun. 6, 2021], 3 pages, Retrieved from the Internet: <URL: https://phys.org/news/2018-02-augmented-reality-d.html>.

* cited by examiner

AUGMENTED REALITY BASED PART IDENTIFICATION

BACKGROUND

The present invention relates generally to the field of computing, and more particularly to Augmented Reality (AR).

Augmented Reality (AR) may enable a creation of a real-and-virtual combined environment in which a user may interact with both real world physical objects and virtual computer-generated (i.e., virtually generated) objects simultaneously. The combined environment may be displayed to a user through one or more IoT (Internet of Things) devices, including, but not limited to including, smart phones, headsets, and/or smart glasses, amongst other IoT devices. AR may be utilized in integrating one or more virtually generated objects with the one or more real world physical objects, such that a user may evaluate how the one or more virtually generated objects interact with the one or more real world physical objects in the combined environment.

Therefore, the user may evaluate the one or more virtually generated objects prior to at least manufacturing and/or ordering the one or more virtually generated objects.

SUMMARY

Embodiments of the present invention disclose a method, computer system, and a computer program product for part identification. The present invention may include observing a user interaction with a physical object using an IoT device. The present invention may include identifying the physical object within a knowledge corpus using one or more image analysis tools. The present invention may include leveraging an identity of the physical object to identify one or more similar interactions with the physical object stored in the knowledge corpus. The present invention may include generating one or more recommendations based on the one or more similar interactions with the physical object. The present invention may include transmitting a user selected recommendation.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
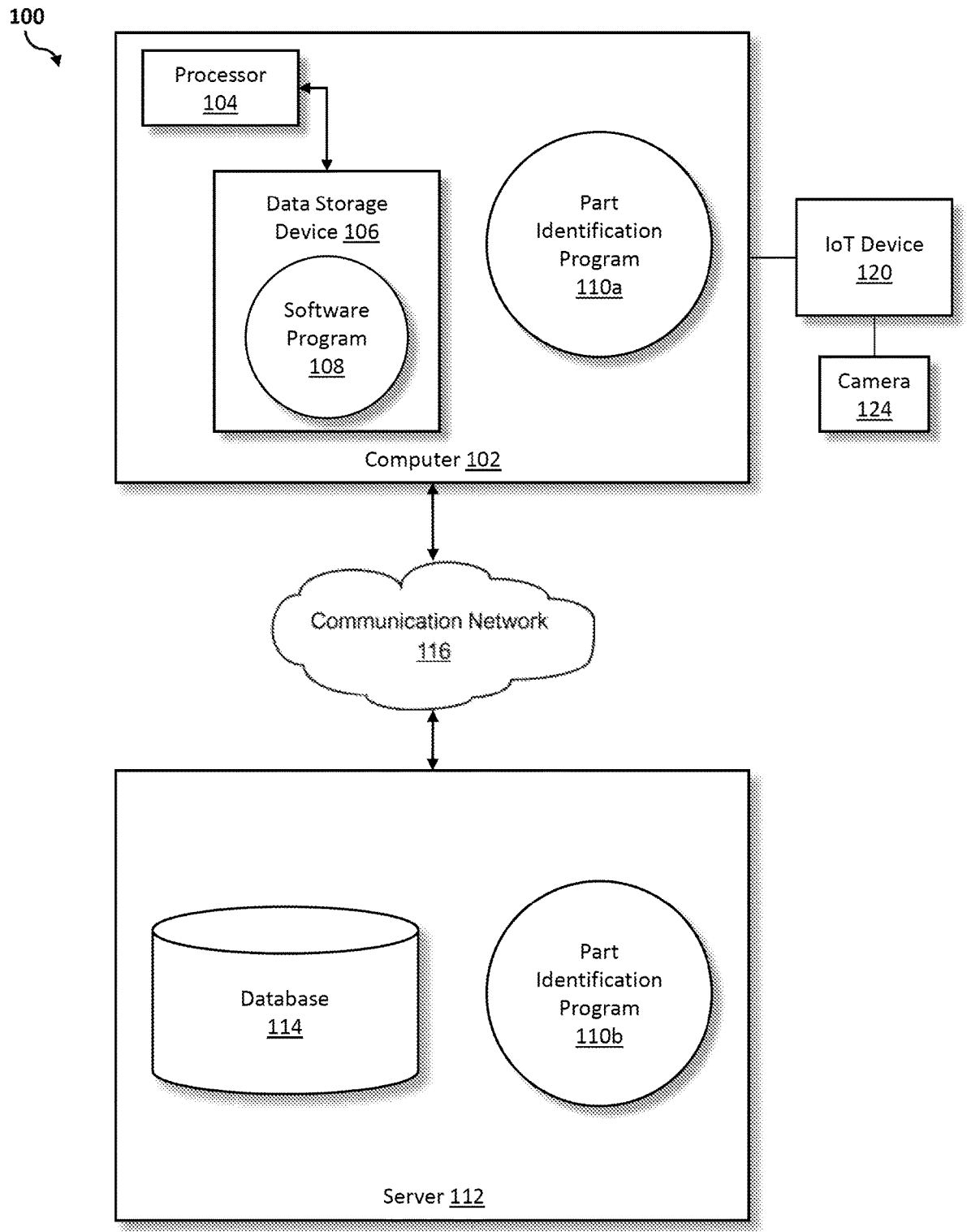
FIG. 1 illustrates a networked computer environment according to at least one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method and program product for part identification. As such, the present embodiment has the capacity to improve the technical field of Augmented Reality (AR) by observing a user interaction with a physical object and generating one or more recommendations based on one or more similar interactions with the physical object. More specifically, the present invention may include observing a user interaction with a physical object using an IoT device. The present invention may include identifying the physical object within a knowledge corpus using one or more image analysis tools. The present invention may include leveraging an identity of the physical object to identify one or more similar interactions with the physical object stored in the knowledge corpus. The present invention may include generating one or more recommendations based on the one or more similar interactions with the physical object. The one or more recommendations may include, but are not limited to including, one or more e-commerce recommendations, instructions on handling the physical object, one or more Augmented Reality (AR) generated parts (e.g., additional parts and/or replacement parts), amongst other recommendations. The present invention may include transmitting a user selected recommendation.

As described previously, Augmented Reality (AR) may enable a creation of a real-and-virtual combined environment in which a user may interact with both real world physical objects and virtual computer-generated (i.e., virtually generated) objects simultaneously. The combined environment may be displayed to a user through one or more IoT (Internet of Things) devices, including, but not limited to including, smart phones, headsets, and/or smart glasses, amongst other IoT devices. AR may be utilized in integrating one or more virtually generated objects with the one or more real world physical objects, such that a user may evaluate how the one or more virtually generated objects interact with the one or more real world physical objects in the combined environment.

Therefore, the user may evaluate the one or more virtually generated objects prior to at least manufacturing and/or ordering the one or more virtually generated objects.

Therefore, it may be more advantageous to, amongst other things, observe a user interaction with a physical object, identify the physical object within a knowledge corpus using one or more image analysis tools, leverage an identity of the physical object to identify one or more similar interactions with the physical object, generate one or more recommendations based on the one or more similar interactions with the physical object, and transmit a user selected recommendation.

According to at least one embodiment, the present invention may improve the ability of a user to evaluate one or more options by generating one or more recommendations based on the one or more similar interactions with the physical object, wherein the one or more recommendations may include, but are not limited to including, one or more e-commerce recommendations, instructions on handling the physical object, one or more Augmented Reality (AR) generated parts (e.g., additional parts and/or replacement parts), amongst other recommendations.

According to at least one embodiment, the present invention may improve the ability of a user to place accurate e-commerce orders by generating one or more e-commerce recommendations. The one or more e-commerce recommendations, may include, but are not limited to including, replacement parts, additional parts, and/or any other product identified on an e-commerce platform determined to facilitate and/or improve the user interaction with the physical object.

According to at least one embodiment, the present invention may improve the usability of a physical object by generating one or more AR generated parts based on at least the analysis of the user interaction with the physical object, one or more images and/or videos identified from the knowledge corpus (e.g., database 114), amongst other factors. The present invention may enable the user to interact with the one or more AR generated parts using IoT device 120, the user may select at least one of the one or more AR generated parts and may edit one or more properties of the AR generated parts. Additionally, the present invention may monitor a gripping pattern, any hand movements, and/or a mobility of the integrated object, among other things. The part identification program 110 may validate the interactions of the user performed based on a verification from the knowledge corpus (e.g., database 114).

According to at least one embodiment, the present invention may improve user interactions with physical objects by allowing a user to interact with and edit the properties of one or more AR generated parts. Furthermore, the present invention may enable the 3D printing of AR generated parts by transmitting the 3D printing instructions to a 3D printer. The 3D printing instructions transmitted to the 3D printer may be based on specifications of the 3D printer and maintain the structural strength requirements of the AR generated parts.

According to at least one embodiment, the present invention may improve user interactions with a physical object by recommending instructions on handling the physical object. The instructions on handling the physical object may be based at least on similar interactions with similar items, properties of the physical object, user data, amongst other information. The instructions on handling the physical object may be user specific, improve body mechanics, prevent injury, prevent damage to the physical object, amongst other benefits. The instructions on handling the physical object may be provided to the user in text, audio, or video format. Additionally, the instructions may include real time notifications displayed to the user based on observations of the user's handling of the physical object.

According to at least one embodiment, the present invention may improve printing of AR generated objects by determining at least a dimension, a shape, and a structural strength requirement based on the physical properties of the physical object.

Referring to FIG. 1, an exemplary networked computer environment 100 in accordance with one embodiment is depicted. The networked computer environment 100 may include a computer 102 with a processor 104 and a data storage device 106 that is enabled to run a software program 108 and a part identification program 110a. The networked computer environment 100 may also include a server 112 that is enabled to run a part identification program 110b that may interact with a database 114 and a communication network 116. The networked computer environment 100 may include a plurality of computers 102 and servers 112, only one of which is shown. The networked computer environment may also include an IoT Device 120, the IoT Device 120 may include a camera 124. The communication network 116 may include various types of communication networks, such as a wide area network (WAN), local area network (LAN), a telecommunication network, a wireless network, a public switched network and/or a satellite network. It should be appreciated that FIG. 1 provides only an illustration of one implementation and does not imply any limitations with regard to the environments in which different embodiments may be implemented. Many modifications to the depicted environments may be made based on design and implementation requirements.

The client computer 102 may communicate with the server computer 112 via the communications network 116. The communications network 116 may include connections, such as wire, wireless communication links, or fiber optic cables. As will be discussed with reference to FIG. 3, server computer 112 may include internal components 902a and external components 904a, respectively, and client computer 102 may include internal components 902b and external components 904b, respectively. Server computer 112 may also operate in a cloud computing service model, such as Software as a Service (SaaS), Platform as a Service (PaaS), or Infrastructure as a Service (IaaS). Server 112 may also be located in a cloud computing deployment model, such as a private cloud, community cloud, public cloud, or hybrid cloud. Client computer 102 may be, for example, a mobile device, a telephone, a personal digital assistant, a netbook, a laptop computer, a tablet computer, a desktop computer, or any type of computing devices capable of running a program, accessing a network, and accessing a database 114. According to various implementations of the present embodiment, the part identification program 110a, 110b may interact with a database 114 that may be embedded in various storage devices, such as, but not limited to a computer/mobile device 102, a networked server 112, or a cloud storage service.

According to the present embodiment, a user using a client computer 102 or a server computer 112 may use the part identification program 110a, 110b (respectively) to generate and display one or more recommendations to a user in an AR environment based on a user interaction with a physical object. The part identification method is explained in more detail below with respect to FIG. 2.

Figure 2:
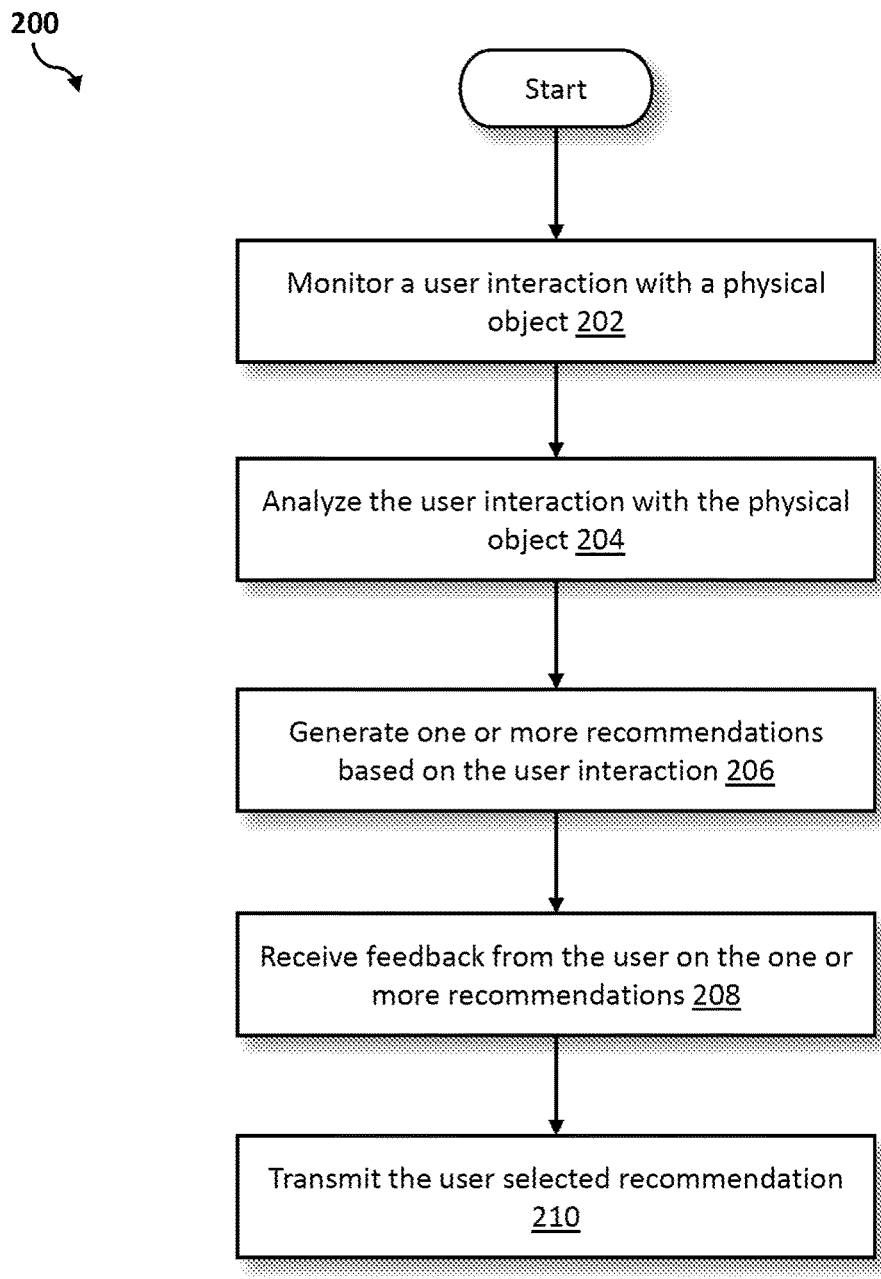
FIG. 2 is an operational flowchart illustrating a process for part identification according to at least one embodiment.

Referring now to FIG. 2, an operational flowchart illustrating the exemplary part identification process 200 used by the part identification program 110a and 110b (hereinafter part identification program 110) according to at least one embodiment is depicted.

At 202, the part identification program 110 monitors a user interaction with a physical object. The part identification program 110 may monitor the user interaction with the physical object utilizing an IoT (Internet of Things) device 120 (e.g., smart glasses, smart phones, smart headsets, Augmented Reality (AR) device) and/or a camera 124 (e.g., infrared tracking stations, sensors, locomotion tracking systems, scanner) connected to the IoT device 120.

As part of the monitoring, the part identification program 110 transmits the user interaction with the physical object to a connected server for analysis using a knowledge corpus (e.g., database 114). The knowledge corpus (e.g., database 114) may be maintained by the part identification program 110 on the connected server. The user interaction transmitted by the part identification program 110 to the connected server may be a short video clip, one or more images, live video feed, motion tracking feed, and/or other depictions of the user interaction with the physical object. The depictions of the user interaction may be saved in the knowledge corpus (e.g., database 114) on the connected server. The part identification 110 may transmit the depiction of the user interaction to the connected server in at least, real time, intermittent time intervals, and/or based on the monitoring of the user interaction.

For example, the part identification program 110 may monitor a user handling a physical object such as a flower vase through a camera 124 attached to the user's smart glasses. The part identification program 110 may transmit a live feed of the user handling the flower vase to the connected server in real time for analysis by the part identification program 110 using the knowledge corpus (e.g., database 114).

At 204, the part identification program 110 analyzes the user interaction with the physical object. The part identification program 110 may analyze the user interaction with the physical object received by the connected server using one or more image analysis tools. The part identification program 110 may utilize the one or more image analysis tools in identifying the physical object and/or similar user interactions with a similar physical object.

The part identification program 110 may utilize image analysis tools, such as, but not limited to, object segmentation techniques, pre-trained classifiers, object-based image analysis, a Convolutional Neural Network (CNN), supervised/unsupervised image classification, in identifying the physical object within a knowledge corpus (e.g., database 114), the knowledge corpus (e.g., database 114) being maintained by the part identification program 110 on a connected server. The part identification program 110 may also utilize one or more properties of the physical object in which the user is interacting, in identifying the physical object. The one or more properties of the physical object may include, but are not limited to including, dimensions, shape, weight, amongst other properties. The user may also input data with respect to the physical object the user is interacting with. The user may input data manually utilizing IoT device 120, such as, but not limited to, make, model, date of manufacture, amongst other manual input data. The user may also utilize the camera 124 of IoT device 120 to scan a Quick Response (QR) code and/or a barcode associated with the physical object.

The part identification program 110 may leverage the identity of the physical object to identify similar user interactions with the physical object and/or similar user interactions with similar physical objects. The part identification program 110 may search at least the images and videos maintained within the knowledge corpus (e.g., database 114). The part identification program 110 may also utilize one or more content identification mechanisms in identifying images and/or video associated with the physical object and interactions with the physical object. The one or more content identification mechanisms may include, but are not limited to including, a web-crawler and/or other search mechanism, IBM Watson® Speech Recognition (IBM Watson® and all Watson-based trademarks are trademarks or registered trademarks of International Business Machines Corporation in the United States, and/or other countries), IBM Watson® Speech to Text, IBM Watson® Text to Speech, IBM Watson® Natural Language Understanding, IBM Watson® Natural Language Processing, amongst other content identification mechanisms.

Continuing with the above example, the part identification 110 may identify the flower vase the user is interacting with based on the one or more image analysis tools. The part identification program 110 may further have determined one or more properties of the flower vase based on the video of the user interaction and verified these one or more properties using the model and manufacturer data input by the user. The part identification program 110 may identify two videos within the knowledge corpus (e.g., database 114) of users interacting with a similar flower vase. Video 1 may show a person lifting up the same flower vase as the user with the flower vase slipping out of the users grip and breaking on the ground. Video 2 may show a person lifting up the flower vase using two handles.

In an alternative embodiment, the user may define within the part identification program 110 using IoT device 120 how the user wishes to interact with the physical object. For example, the part identification program 110 may identify an object such as a washing machine. The user may define within the part identification program 110 that the user wishes to move the washing machine a specified distance, the user may demonstrate to the identification program 110 where the washing machine needs to be moved to from where it currently is. As will be explained in more detail below, the part identification program 110 may generate one or more recommendations specific to the user on how to most effectively move the washing machine based on at least, the surface over which the washing machine must travel, the one or more properties of the washing machine, and any available user data.

At 206, the part identification program 110 generates one or more recommendations based on the user interaction with the physical object. The part identification program 110 may display the one or more recommendations to the user utilizing IoT device 120 (e.g., smart glasses, smart phones, smart headsets, AR device). The part identification program 110 may display the one or more recommendations to the user on the IoT device 120 using at least a display screen of the IoT device 120, a dedicated software application on IoT device 120, amongst other methods of display.

The part identification program 110 may utilize one or more sentiment analysis tools in evaluating the videos and/or images identified from the knowledge corpus (e.g., database 114). The one or more sentiment analysis tools may include, but are not limited to including, Natural Language Processing (NLP) techniques, such as those implemented in IBM Watson® (IBM Watson® and all Watson-based trademarks are trademarks or registered trademarks of International Business Machines Corporation in the United States, and/or other countries), IBM Watson® Tone Analyzer, IBM Watson® Natural Language Understanding, IBM Watson® Natural Language Processing, amongst other sentiment analysis tools. For example, in the example above in which the flower vase broke in Video 1 and was lifted by the handles in Video 2, the part identification program 110 utilizing the one or more sentiment analysis tools may assign a negative sentiment to "no handles" and a positive sentiment to "handles."

The part identification program 110 may utilize a machine learning model in generating the one or more recommendations for the user. The machine learning model may utilize at least the sentiment analysis of the images and/or videos identified in the knowledge corpus (e.g., database 114), properties of the physical object, user interaction and/or desired user interaction, user data, amongst other input, in generating the one or more recommendations for the user. User data may include, but is not limited to including, medical records such as injury history, data obtained from a smart wearable device, or any other user data which may be utilized in understanding the physical health of the user. The part identification program 110 may only receive and/or utilize user data consented to by the user.

The part identification program 110 may generate the one or more recommendations for the user. The one or more recommendations may include, but are not limited to including, one or more e-commerce recommendations, instructions on handling the physical object, one or more Augmented Reality (AR) generated parts (e.g., additional parts and/or replacement parts), amongst other recommendations.

The part identification program 110 may generate one or more e-commerce recommendations. The one or more e-commerce recommendations may include, but are not limited to including, replacement parts, additional parts, and/or any other product identified on an e-commerce platform determined by the part identification program 110 to facilitate and/or improve the user interaction with the physical object. The part identification program 110 may evaluate the one or more e-commerce recommendations utilizing the one or more sentiment analysis tools outlined above prior to displaying the one or more e-commerce recommendations to the user. For example, continuing the washing machine example from step 204 above, utilizing the machine learning model, the part identification program 110 may determine a trolly is the best way for the user to move the washing machine the specified distance. The part identification program 110 may utilize the one or more sentiment analysis tools to recommend a specific trolly based on at least a sentiment analysis of user reviews. Additionally, as will be explained in more detail below, the part identification program 110 may recommend instructions on handling the washing machine using the trolly. The part identification program 110 may utilize at least one or more images and/or videos from the knowledge corpus (e.g., database 114), the one or more content identification mechanisms outlines, such as the properties of the washing machine, and any available user data in recommending instructions on handling the washing machine using the trolly.

The part identification program 110 may generate instructions on handling the physical object based at least on similar interactions with similar items stored in the knowledge corpus (e.g., database 114), properties of the physical object, user data, amongst other information. The instructions on handling the physical object may be user specific based on at least the user data. The part identification program 110 may only receive and/or utilize user data consented to by the user. For example, based on the analysis of the user interaction with the physical object and the user data, the part identification program 110 may display a warning to the user, if the user's motion is likely to reaggravate an injury from the user's medical records or display a notification to the user based on user data received from a smart wearable device of the user showing an abnormally elevated heart rate as compared to historical heart rate data received from the user. The part identification program 110 in this example may recommend a video to the user demonstrating how to lift using your legs as opposed to putting stress on the user's lower back. The part identification program 110 may further monitor the user interaction with the physical object and provide additional recommendations and/or input.

The part identification program 110 may recommend one or more AR generated parts. The one or more AR generated parts may be displayed to the user using IoT device 120 using at least a display screen of the IoT device 120, a dedicated software application on IoT device 120, amongst other methods. The one or more AR generated parts may be generated by the part identification program 110 based on at least the analysis of the user interaction with the physical object, one or more images and/or videos identified from the knowledge corpus (e.g., database 114), amongst other factors. The part identification program 110 may enable the user to interact with the one or more AR generated parts using IoT device 120, the user may select at least one of the one or more AR generated parts and may edit one or more properties of the AR generated parts. The one or more properties the user may edit include, but are not limited to including, shape, size, and/or color, amongst other properties. As will be explained in more detail below with respect to step 208, edits to the one or more properties of the AR generated parts by the user may be utilized as feedback in retraining the machine learning model utilized in generating one or more recommendations.

The user may interact with the AR generated part integrated with the physical object. The part identification program 110 may monitor a gripping pattern, any hand movements, and/or a mobility of the integrated object, among other things. The part identification program 110 may validate the interactions of the user performed based on a verification from the knowledge corpus (e.g., database 114).

The part identification program 110 may determine the dimension, shape, and/or structural strength requirements, among other things, of the one or more AR generated parts. The part identification program 110 may allow the user to edit the one or more properties of the one or more AR generated parts within the dimension, shape, and structural strength requirements. For example, based on the one or more properties of a flower vase, such as weight, the user may be limited in editing the shape and size of the AR generated handles to the extent the handles retain the structural strength requirements to support the flower vase.

The part identification program 110 may generate 3D printing instructions for the one or more AR generated parts. The part identification program 110 may determine whether the one or more AR generated parts may be 3D printed on a user's own 3D printer. For example, the user may integrate a 3D printer with the part identification program 110, including 3D printer specifications, which may include, but are not limited to including, print chamber dimensions, 3D printer make and model, nozzle dimensions, nozzle materials, surface area of the print bed, and/or materials available for printing, amongst other 3D printer specifications. Alternatively, the part identification program 110 may generate general 3D printing instructions which may be outsourced to a third-party for 3D printing.

The part identification program 110 may transmit one or more notifications to the user based on at least the one or more AR generated parts and the 3D printer specifications. The notifications may be at least an audio and/or a visual notification as to whether the 3D printer specifications can meet the dimensions, shape, and/or strength requirements, among other requirements, of the AR generated parts, as well as a price of printing the one or more AR generated parts based on materials and other cost factors.

At 208, the part identification program 110 receives feedback from the user based on the one or more recommendations. The part identification program 110 may receive feedback from the user based on a selected recommendation and/or one or more non-selected recommendations.

Feedback from the user may include, but is not limited to including, selecting an e-commerce recommendation, editing the one or more properties of the AR generated part, manual feedback, reviews of e-commerce orders, reviews of AR generated parts, amongst other recommendations. The part identification program 110 may retrain the machine learning model utilized in generating the one or more recommendations above at step 206 based on the feedback received from the user. Feedback from the user may be utilized by the machine learning model to generate both user specific recommendations and/or improve recommendations to other users of the part identification program.

For example, a user may select a less expensive e-commerce recommendation with a lower sentiment over a more expensive e-commerce recommendation with a higher sentiment. The part identification program 110 may retrain the machine learning model to weight the monetary cost of an e-commerce recommendation more and weight the sentiment of the e-commerce recommendation less for the user. Another example may be that the user consistently edits the color of the AR generated part to the color green. The part identification program 110 may automatically present to the user AR generated parts in green. Alternatively, as will be explained below, feedback from the user may be utilized in retraining the machine learning model generally based on feedback from the user based on a received recommendation (e.g., 3D printed AR generated part, e-commerce order received by the user).

At 210, the part identification program 110 transmits a user selected recommendation. The part identification program 110 may transmit the user selected recommendation by at least placing an order on an e-commerce website, displaying the instructions on handling the physical object and/or a hyperlink to the instructions, and/or transmitting the 3D printing instructions for the one or more AR generated parts, amongst other transmissions.

The part identification program 110 may print the one or more AR generated parts directly on the physical object using one or more adhesives, and/or may print the AR generated parts separately allowing the user to add the one or more AR generated parts to the physical object. As outlined above with respect to step 206, the one or more AR generated parts may be printed based on 3D printer specifications. The 3D printer specifications may include, but are not limited to including, print chamber dimensions, 3D printer make and model, nozzle dimensions, nozzle materials, surface area of the print bed, and/or materials available for printing, amongst other 3D printer specifications.

The user may provide feedback based on the selected recommendation. The part identification program 110 may utilize the feedback based on the selected recommendation to retrain the machine learning model of utilized at step 206 in generating the one or more recommendations. For example, if in the washing machine example the trolly recommended to move the washing machine was too small or broke down the part identification program 110 may retrain the machine learning model with respect to both the physical object and/or physical objects with similar physical properties, in this example, size and weight.

It may be appreciated that FIG. 2 provides only an illustration of one embodiment and do not imply any limitations with regard to how different embodiments may be implemented. Many modifications to the depicted embodiment(s) may be made based on design and implementation requirements.

Figure 3:
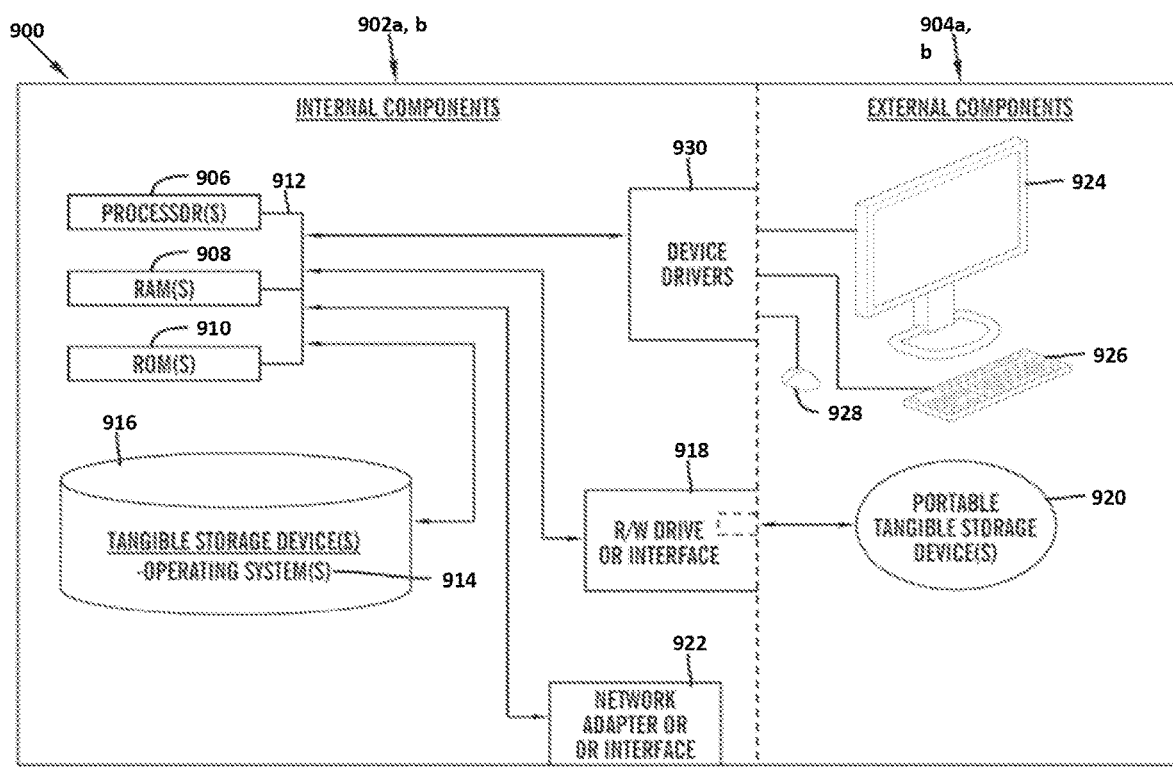
FIG. 3 is a block diagram of internal and external components of computers and servers depicted in FIG. 1 according to at least one embodiment.

FIG. 3 is a block diagram 900 of internal and external components of computers depicted in FIG. 1 in accordance with an illustrative embodiment of the present invention. It should be appreciated that FIG. 3 provides only an illustration of one implementation and does not imply any limitations with regard to the environments in which different embodiments may be implemented. Many modifications to the depicted environments may be made based on design and implementation requirements.

Data processing system 902, 904 is representative of any electronic device capable of executing machine-readable program instructions. Data processing system 902, 904 may be representative of a smart phone, a computer system, PDA, or other electronic devices. Examples of computing systems, environments, and/or configurations that may represented by data processing system 902, 904 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

User client computer 102 and network server 112 may include respective sets of internal components 902 *a, b* and external components 904 *a, b* illustrated in FIG. 3. Each of the sets of internal components 902 *a, b* includes one or more processors 906, one or more computer-readable RAMs 908 and one or more computer-readable ROMs 910 on one or more buses 912, and one or more operating systems 914 and one or more computer-readable tangible storage devices 916. The one or more operating systems 914, the software program 108, and the part identification program 110*a* in client computer 102, and the part identification program 110*b* in network server 112, may be stored on one or more computer-readable tangible storage devices 916 for execution by one or more processors 906 via one or more RAMs 908 (which typically include cache memory). In the embodiment illustrated in FIG. 3, each of the computer-readable tangible storage devices 916 is a magnetic disk storage device of an internal hard drive. Alternatively, each of the computer-readable tangible storage devices 916 is a semiconductor storage device such as ROM 910, EPROM, flash memory or any other computer-readable tangible storage device that can store a computer program and digital information.

Each set of internal components 902 *a, b* also includes a R/W drive or interface 918 to read from and write to one or more portable computer-readable tangible storage devices 920 such as a CD-ROM, DVD, memory stick, magnetic tape, magnetic disk, optical disk or semiconductor storage device. A software program, such as the software program 108 and the part identification program 110*a* and 110*b* can be stored on one or more of the respective portable computer-readable tangible storage devices 920, read via the respective R/W drive or interface 918 and loaded into the respective hard drive 916.

Each set of internal components 902 *a, b* may also include network adapters (or switch port cards) or interfaces 922 such as a TCP/IP adapter cards, wireless wi-fi interface cards, or 3G or 4G wireless interface cards or other wired or wireless communication links. The software program 108 and the part identification program 110*a* in client computer 102 and the part identification program 110*b* in network server computer 112 can be downloaded from an external computer (e.g., server) via a network (for example, the Internet, a local area network or other, wide area network) and respective network adapters or interfaces 922. From the network adapters (or switch port adaptors) or interfaces 922, the software program 108 and the part identification program 110*a* in client computer 102 and the part identification program 110*b* in network server computer 112 are loaded into the respective hard drive 916. The network may comprise copper wires, optical fibers, wireless transmission, routers, firewalls, switches, gateway computers and/or edge servers.

Each of the sets of external components 904 *a, b* can include a computer display monitor 924, a keyboard 926, and a computer mouse 928. External components 904 *a, b* can also include touch screens, virtual keyboards, touch pads, pointing devices, and other human interface devices. Each of the sets of internal components 902 *a, b* also includes device drivers 930 to interface to computer display monitor 924, keyboard 926 and computer mouse 928. The device drivers 930, R/W drive or interface 918 and network adapter or interface 922 comprise hardware and software (stored in storage device 916 and/or ROM 910).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 4:
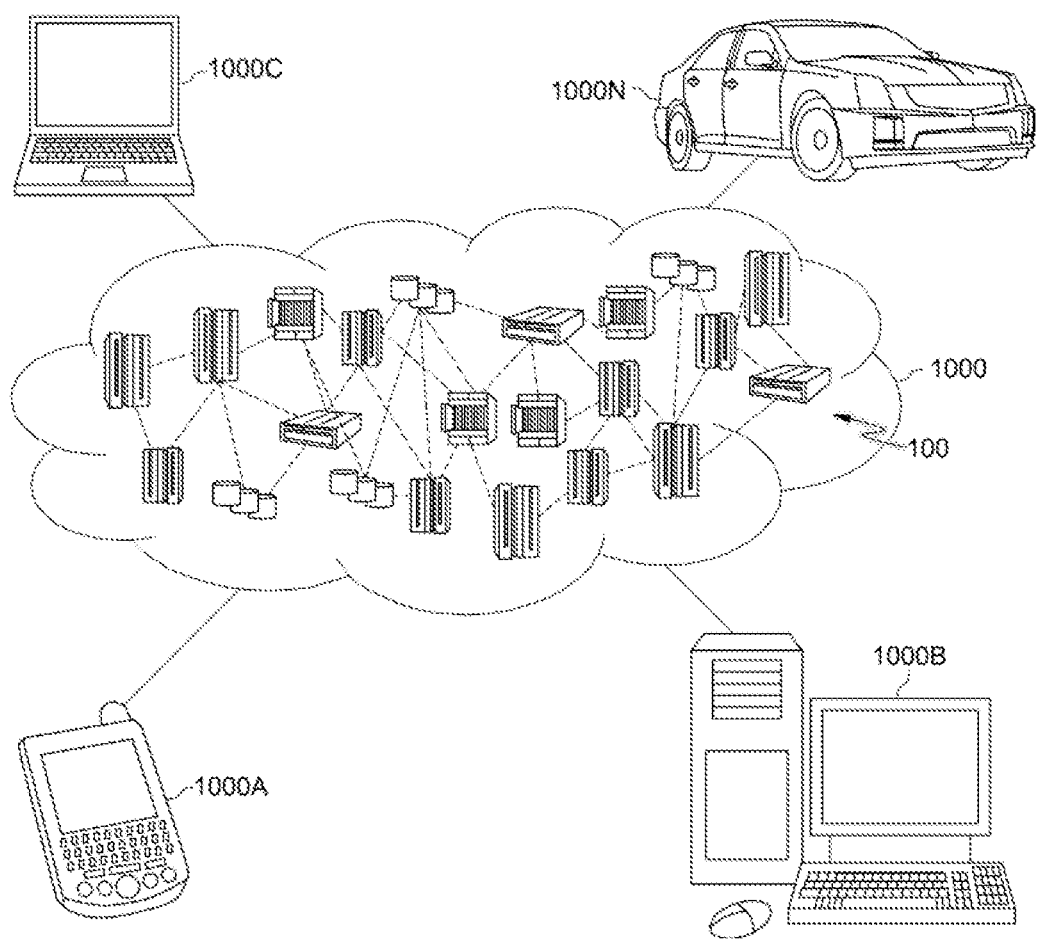
FIG. 4 is a block diagram of an illustrative cloud computing environment including the computer system depicted in FIG. 1, in accordance with an embodiment of the present disclosure.

Referring now to FIG. 4, illustrative cloud computing environment 1000 is depicted. As shown, cloud computing environment 1000 comprises one or more cloud computing nodes 100 with which local computing devices used by cloud consumers, such as, for example, personal digital assistant (PDA) or cellular telephone 1000A, desktop computer 1000B, laptop computer 1000C, and/or automobile computer system 1000N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 1000 to offer infrastructure, platforms and/or software as services for which a cloud consumer does not need to maintain resources on a local computing device. It is understood that the types of computing devices 1000A-N shown in FIG. 4 are intended to be illustrative only and that computing nodes 100 and cloud computing environment 1000 can communicate with any type of computerized device over any type of network and/or network addressable connection (e.g., using a web browser).

Figure 5:
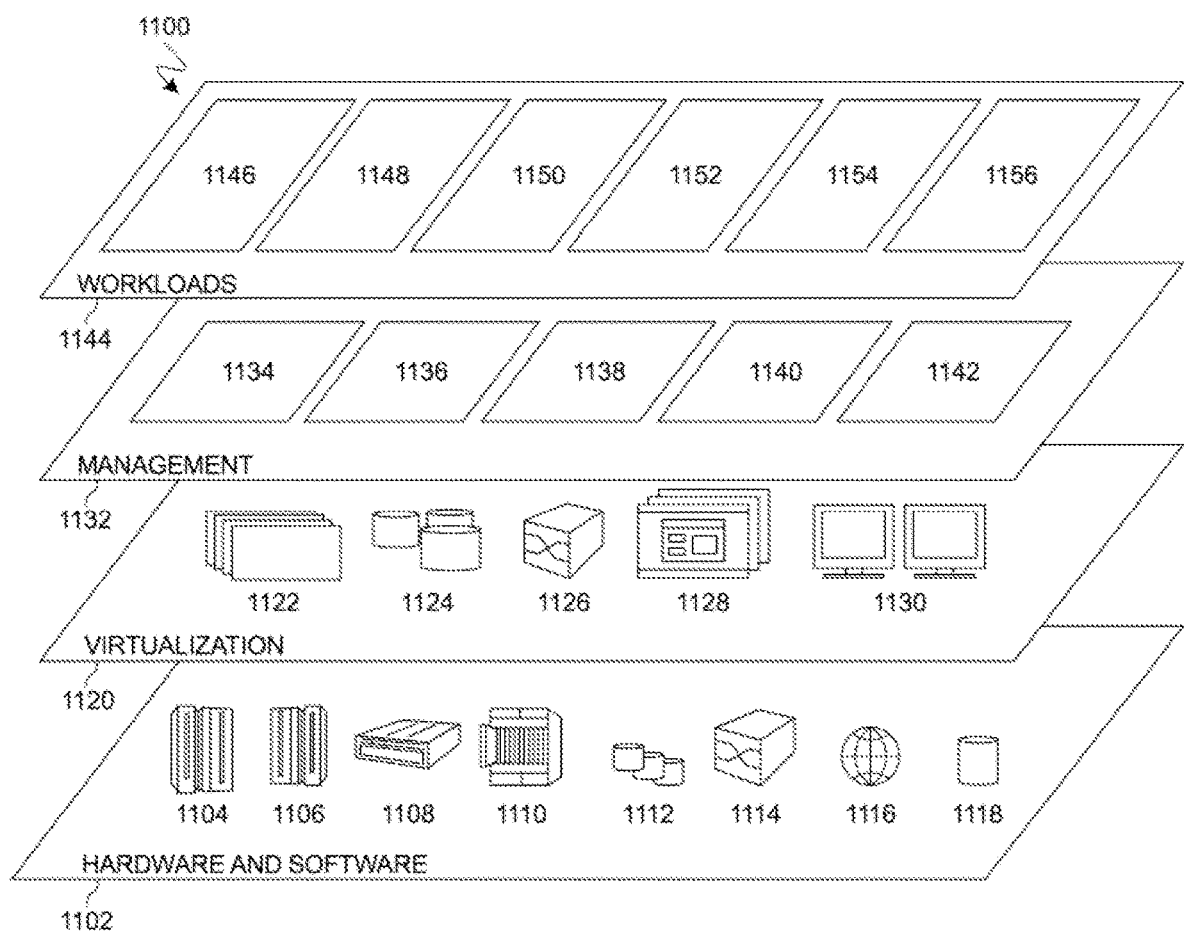
FIG. 5 is a block diagram of functional layers of the illustrative cloud computing environment of FIG. 4, in accordance with an embodiment of the present disclosure.

Referring now to FIG. 5, a set of functional abstraction layers 1100 provided by cloud computing environment 1000 is shown. It should be understood in advance that the components, layers, and functions shown in FIG. 5 are intended to be illustrative only and embodiments of the invention are not limited thereto. As depicted, the following layers and corresponding functions are provided:

Hardware and software layer 1102 includes hardware and software components. Examples of hardware components include: mainframes 1104; RISC (Reduced Instruction Set Computer) architecture based servers 1106; servers 1108; blade servers 1110; storage devices 1112; and networks and networking components 1114. In some embodiments, software components include network application server software 1116 and database software 1118.

Virtualization layer 1120 provides an abstraction layer from which the following examples of virtual entities may be provided: virtual servers 1122; virtual storage 1124; virtual networks 1126, including virtual private networks; virtual applications and operating systems 1128; and virtual clients 1130.

In one example, management layer 1132 may provide the functions described below. Resource provisioning 1134 provides dynamic procurement of computing resources and other resources that are utilized to perform tasks within the cloud computing environment. Metering and Pricing 1136 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 1138 provides access to the cloud computing environment for consumers and system administrators. Service level management 1140 provides cloud computing resource allocation and management such that required service levels are met. Service Level Agreement (SLA) planning and fulfillment 1142 provide pre-arrangement for, and procurement of, cloud computing resources for which a future requirement is anticipated in accordance with an SLA.

Workloads layer 1144 provides examples of functionality for which the cloud computing environment may be utilized. Examples of workloads and functions which may be provided from this layer include: mapping and navigation 1146; software development and lifecycle management 1148; virtual classroom education delivery 1150; data analytics processing 1152; transaction processing 1154; and part identification program 1156. A part identification program 110a, 110b provides a way to generate and display one or more recommendations to a user in an AR environment based on a user interaction with a physical object.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

The present disclosure shall not be construed as to violate or encourage the violation of any local, state, federal, or international law with respect to privacy protection.

What is claimed is:

1. A method for part identification, the method comprising:
observing a user interaction with a physical object using an Internet of Things (IoT) device;
identifying the physical object within a knowledge corpus using one or more image analysis tools;
leveraging an identity of the physical object to identify one or more similar interactions with the physical object stored in the knowledge corpus;
generating one or more recommendations using a machine learning model based on a sentiment analysis of the one or more similar interactions with the physical object, wherein the one or more recommendations include at least one or more of instructions on handling the physical object, one or more e-commerce recommendations, or one or more Augmented Reality (AR) generated parts;
receiving a user selected recommendation from the one or more recommendations displayed to the user on the IoT device; and
retraining the machine learning model for future recommendations by adjusting a weighting of the sentiment analysis against other factors based on the user selected recommendation.

2. The method of claim 1, further comprising:
determining at least a dimension, a shape, and a structural strength requirement for each of the one or more AR generated parts, wherein the one or more AR generated parts are displayed to the user on the IoT device; and
receiving feedback from the user based on the one or more AR generated parts, wherein the feedback received from the user includes edits to one or more properties of the one or more AR generated parts, wherein the edits are within the dimension, the shape, and the structural strength requirement for each of the one or more generated parts.

3. The method of claim 2, further comprising:
transmitting one or more three dimensional (3D) printing instructions for at least one of the one or more AR generated parts selected by the user to a 3D printer, wherein the one or more 3D printing instructions are determined based on specifications of the 3D printer.

4. The method of claim 1, further comprising:
displaying, on the IoT device, the instructions on handling the physical object, wherein the instructions are based on at least user data received from a smart wearable device;
monitoring the user interaction with the physical object using live feed from the IoT device and real time data from the smart wearable device; and
displaying, on the IoT device, a warning to the user.

5. The method of claim 1, wherein the user selected recommendation is utilized in retraining a machine learning model for generating future recommendations related to the physical object and one or more additional physical objects, wherein the one or more additional physical objects share one or more physical properties with the physical object.

6. The method of claim 3, wherein the edits to the one or more properties of the one or more AR generated parts are utilized in retraining a machine learning model for generating future user specific recommendations and future recommendations to other users.

7. The method of claim 4, wherein the warning is based on a deviation from the instructions determined based on the live feed or the real time data received from the smart wearable device.

8. The method of claim 1, further comprising:
transmitting the user selected recommendation to an ecommerce website, wherein the user selected recommendation is at least one of the one or more ecommerce recommendations generated based on the sentiment analysis.

9. A computer system for part identification, comprising:
one or more processors, one or more computer-readable memories, one or more computer-readable tangible storage medium, and program instructions stored on at least one of the one or more tangible storage medium for execution by at least one of the one or more processors via at least one of the one or more memories, wherein the computer system is capable of performing a method comprising:
observing a user interaction with a physical object using an Internet of Things (IoT) device;
identifying the physical object within a knowledge corpus using one or more image analysis tools;
leveraging an identity of the physical object to identify one or more similar interactions with the physical object stored in the knowledge corpus;
generating one or more recommendations using a machine learning model based on a sentiment analysis of the one or more similar interactions with the physical object, wherein the one or more recommendations include at least one or more of instructions on handling the physical object, one or more e-commerce recommendations, or one or more Augmented Reality (AR) generated parts;
receiving a user selected recommendation from the one or more recommendations displayed to the user on the IoT device; and
retraining the machine learning model for future recommendations by adjusting a weighting of the sentiment analysis against other factors based on the user selected recommendation.

10. The computer system of claim 9, further comprising:
determining at least a dimension, a shape, and a structural strength requirement for each of the one or more AR generated parts, wherein the one or more AR generated parts are displayed to the user on the IoT device; and
receiving feedback from the user based on the one or more AR generated parts, wherein the feedback received from the user includes edits to one or more properties of the one or more AR generated parts, wherein the edits are within the dimension, the shape, and the structural strength requirement for each of the one or more generated parts.

11. The computer system of claim 10, further comprising:
transmitting one or more three dimensional (3D) printing instructions for at least one of the one or more AR generated parts selected by the user to a 3D printer, wherein the one or more 3D printing instructions are determined based on specifications of the 3D printer.

12. The computer system of claim 9, further comprising:
displaying, on the IoT device, the instructions on handling the physical object, wherein the instructions are based on at least user data received from a smart wearable device;
monitoring the user interaction with the physical object using live feed from the IoT device and real time data from the smart wearable device; and
displaying, on the IoT device, a warning to the user, wherein the warning is based on a deviation from the instructions determined based on the live feed or the real time data received from the smart wearable device.

13. The computer system of claim 9, further comprising:
transmitting the user selected recommendation to an ecommerce website, wherein the user selected recommendation is at least one of the one or more ecommerce recommendations generated based on the sentiment analysis.

14. The computer system of claim 11, wherein the edits to the one or more properties of the one or more AR generated parts are utilized in retraining a machine learning model for generating future user specific recommendations and future recommendations to other users.

15. A computer program product for part identification, comprising:
one or more non-transitory computer-readable storage media and program instructions stored on at least one of the one or more tangible storage media, the program instructions executable by a processor to cause the processor to perform a method comprising:
observing a user interaction with a physical object using an Internet of Things (IoT) device;
identifying the physical object within a knowledge corpus using one or more image analysis tools;
leveraging an identity of the physical object to identify one or more similar interactions with the physical object stored in the knowledge corpus;
generating one or more recommendations using a machine learning model based on a sentiment analysis of the one or more similar interactions with the physical object, wherein the one or more recommendations include at least one or more of instructions on handling the physical object, one or more e-commerce recommendations, or one or more Augmented Reality (AR) generated parts;
receiving a user selected recommendation from the one or more recommendations displayed to the user on the IoT device; and
retraining the machine learning model for future recommendations by adjusting a weighting of the sentiment analysis against other factors based on the user selected recommendation.

16. The computer program product of claim 15, further comprising:
determining at least a dimension, a shape, and a structural strength requirement for each of the one or more AR generated parts, wherein the one or more AR generated parts are displayed to the user on the IoT device; and
receiving feedback from the user based on the one or more AR generated parts, wherein the feedback received from the user includes edits to one or more properties of the one or more AR generated parts, wherein the edits are within the dimension, the shape, and the structural strength requirement for each of the one or more generated parts.

17. The computer program product of claim 16, further comprising:
transmitting one or more three dimensional (3D) printing instructions for at least one of the one or more AR generated parts selected by the user to a 3D printer, wherein the one or more 3D printing instructions are determined based on specifications of the 3D printer.

18. The computer program product of claim 15, further comprising:

transmitting the user selected recommendation to an ecommerce website, wherein the user selected recommendation is at least one of the one or more ecommerce recommendations generated based on the sentiment analysis.

19. The computer program product of claim 17, wherein the edits to the one or more properties of the one or more AR generated parts are utilized in retraining a machine learning model for generating future user specific recommendations and future recommendations to other users.

* * * * *